(12) United States Patent
Gu et al.

(10) Patent No.: US 8,693,243 B2
(45) Date of Patent: Apr. 8, 2014

(54) MEMORY ARRAY

(75) Inventors: Jing Gu, Shanghai (CN); Bo Zhang, Shanghai (CN); Weiran Kong, Shanghai (CN); Jian Hu, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 215 days.

(21) Appl. No.: 13/253,855

(22) Filed: Oct. 5, 2011

(65) Prior Publication Data

US 2012/0206969 A1    Aug. 16, 2012

(30) Foreign Application Priority Data

Feb. 10, 2011    (CN) .......................... 2011 1 0035558

(51) Int. Cl.
*G11C 11/34* (2006.01)

(52) U.S. Cl.
USPC ............ 365/185.01; 365/185.14; 365/185.17; 365/185.1

(58) Field of Classification Search
USPC ................. 365/185.01, 185.14, 185.17, 185.1
See application file for complete search history.

(56) References Cited

U.S. PATENT DOCUMENTS

| 5,414,693 | A  | * | 5/1995 | Ma et al. ..................... 365/185.1 |
| 6,281,545 | B1 | * | 8/2001 | Liang et al. .................. 257/315 |
| 2002/0045319 | A1 | * | 4/2002 | Ogura et al. .................. 438/303 |
| 2004/0057264 | A1 | * | 3/2004 | Houdt et al. .................... 365/45 |
| 2005/0207199 | A1 | * | 9/2005 | Chen et al. ....................... 365/51 |

FOREIGN PATENT DOCUMENTS

EP     0 109 853 A2    5/1984

\* cited by examiner

*Primary Examiner* — Vu Le
*Assistant Examiner* — Han Yang
(74) *Attorney, Agent, or Firm* — Alleman Hall McCoy Russell & Tuttle LLP

(57) ABSTRACT

A memory array used in the field of semiconductor technology includes a plurality of memory cells, bit lines, word lines perpendicular to the bit lines, and first/second control lines. The memory array uses split-gate memory cells, wherein two memory bit cells of a memory cell share one word line, thereby the read, program and erase of the memory cell can be realized by applying different voltages to the word line, two control gates and source/drain regions; the word line sharing structure enables a split-gate flash memory to effectively reduce the chip area and avoid over-erase problems while maintaining electrical isolation performance of the chip unchanged and not increasing the complexity of the process.

14 Claims, 2 Drawing Sheets

MEMORY ARRAY

CROSS-REFERENCE TO RELATED APPLICATION

This application claims the priority to Chinese patent application number 201110035558.X, filed on Feb. 10, 2011, the entire contents of which are incorporated herein by reference.

TECHNICAL FIELD

The present invention relates to a memory array, in particular, relates to a memory array of split-gate flash memory structures and its programming method.

BACKGROUND

Flash memory has become a research hot spot in non-volatile memories for its advantages of convenience, high storage density and good reliability. With developments of technology and storage requirements of electronic products, flash memory has been widely used in mobile and communication devices, such as mobile phones, laptop computers, PDAs and USB flash drives. Flash memory, as a kind of non-volatile memory, is operated by modifying the threshold voltage of the transistor or memory cell to control the on/off state of the channel, so as to realize the storage of data and ensures that the data stored in the memory will not be lost in case of power outage. Flash memory is also a special structure of electrically erasable programmable read-only memory. Currently, flash memory has occupied most of the market share of non-volatile semiconductor memories and has become a non-volatile semiconductor memory with the fastest developing speed.

However, when the existing flash memories are developing towards a higher storage density, it is difficult to increase the storage density by reducing the size of the device due to the restriction of the programming voltage. Moreover, further reducing the programming voltage of the device is facing great challenges due to the limitation of the structure. Generally, a flash memory is of a split gate type or a stacked gate type, or a combination thereof. Compared to a stacked-gate flash memory, a split-gate flash memory has unique advantages in programming and erasing operations for its special structure, therefore, it is widely used due to its high programming efficiency and its advantage of avoiding over-erase owing to its word line structure. However, the split-gate flash memory has one more word line than the stacked-gate flash memory, which makes chip area increase. To introduce memory cells with higher packaging density into a semiconductor memory device, the layout of memory device circuits with a smaller size must be used. Therefore, in order to solve the problems caused by high-density packaging of the memory cells, the structure of the semiconductor memory device must be improved.

So far, many attempts have been made to increase the density of memory cells. For example, EP0109853A2 disclosed an array of MOS transistors formed on a semiconductor substrate with a plurality of bit lines serving as the source and drain regions of the MOS transistors, wherein a plurality of conductive word lines are formed above the plurality of bit lines, being insulated from and perpendicular to the bit lines, each conductive word line serving as the gates of a plurality of MOS transistors. Each transistor of the memory array is formed in a region containing two bit lines and a single word line and forms a contact with each bit line. To avoid danger and reduce the capacitance between conductive lines, a thin film of field oxide is formed on bit lines to isolate the bit lines from the polysilicon lines. In addition, generally, between adjacent bit lines and adjacent polysilicon lines, a thick layer of field oxide is needed to isolate a memory cell from its adjacent cell, so as to minimize point coupling between them. As each bit line is connected to a conductive metal contact line, metal lines must be formed intensively on a single semiconductor wafer, and the increase of cell density will correspondingly increase the intensity of metal lines, as a result, the complexity and cost of the manufacturing process is largely increased because lines with very small critical dimensions need to be formed during the photolithography and etch processes. Therefore, such method for increasing density of memory cells has high requirements on process conditions and is not suitable for popularization and promotion.

SUMMARY OF THE INVENTION

An objective of the present invention is to provide a memory array which can effectively reduce the area of a chip and simultaneously can avoid over-erase problems while maintaining the electrical isolation performance of the chip unchanged, so as to solve the problem of requiring a very advanced technology to increase the density of a memory array in the prior art.

To achieve the above objective, the memory array of the present invention comprises: a plurality of memory cells, a plurality of paralleled bit lines formed on a semiconductor substrate, and a plurality of word lines perpendicular to the bit lines, wherein each bit line is connected to a source and a drain of adjacent memory cells, while a part of a word line between adjacent bit lines is connected to a gate of a memory cell. In the memory array, the memory cells are split-gate memory cells, each including a first memory bit cell arranged between the word line and a source of the memory cell, and a second memory bit cell arranged between the word line and a drain of the memory cell, the first and second memory bit cells comprising a first control gate and a second control gate, respectively; the memory array further comprises a plurality of first control lines and second control lines connected to the first and the second control gates, respectively, each pair of the first and the second control lines being arranged on both sides of a word line and being parallel to the word line.

Furthermore, a part of a bit line forms the source and the drain of adjacent memory cells connected to the bit line; a part of a word line forms the gate of the memory cell connected to the word line.

Furthermore, the first memory bit cell further comprises a first floating gate, the first control gate is spaced from and arranged above the first floating gate; the second memory bit cell further comprises a second floating gate, the second control gate is spaced from and arranged above the second floating gate.

Furthermore, the part of the word line forming the gate of a memory cell is isolated from the semiconductor substrate, the first floating gate and second floating gate by a tunneling oxide layer; gate oxide layers are formed between the first floating gate and the semiconductor substrate, as well as between the second floating gate and the semiconductor substrate.

Furthermore, the tunneling oxide layer has a thickness from 80 Å to 200 Å, and the gate oxide layers formed between the part of the word line forming the gate of a memory cell and the semiconductor substrate have a thickness from 80 Å to 200 Å.

Furthermore, interlayer dielectric films are formed between the first floating gate and the first control gate, between the second floating gate and the second control gate, as well as between the word line and the first and second control gates.

Furthermore, the interlayer dielectric films are insulating dielectric films formed by one of silicon dioxide, silicon nitride, silicon oxynitride, carbon-containing silicon oxide or any combination structure thereof.

Furthermore, both the first and the second floating gates are polysilicon floating gates, silicon nitride floating gates or nano-crystal materials having electrical conductivity; both the first and second control gates are polysilicon control gates or metal control gates; the word lines are polysilicon selection gates or metal selection gates.

Furthermore, the word line, the first and second control lines are all arranged below or above the bit lines.

Furthermore, the first and the second memory bit cells share one word line, operating voltages are applied to the word line, the first control gates, the second control gate, and the bit lines connected to the source and the drain to read, program and erase the memory bit cells.

Alternatively, the first and the second memory bit cells erase electric charges by applying a high voltage to the word line. And furthermore, both the first and the second control gates of the memory cells are polysilicon control gates, when the word line is polysilicon selection gate, both the first and second memory bit cells use a poly to poly erase.

When performing an erasing operation to the first and the second memory bit cells, the erasing voltage applied to the word line is from 9 V to 12 V, and preferably 11 V.

Alternatively, both the first and the second memory bit cells erase electric charges by applying a high voltage to the word line and applying a negative voltage to the first/second control gate, the high voltage applied to the word lines is from 5 V to 10 V, preferably 8 V; the negative voltage applied to the first/second control gate is from −5 V to −10 V, preferably −7 V.

Furthermore, the first and the second memory bit cells are programmed by hot electron injection. During a programming operation to the first memory bit cell, programming voltages applied to the word line, the first control gate, the second control gate, the bit line connected to the source and the bit line connected to the drain are from 1 V to 2 V, from 5 V to 11 V, from 2 V to 6 V, from 2.5 V to 5.5 V and from 0 V to 0.6 V, and preferably 1.5 V, 10 V, 4 V, 5 V and 0 V respectively; during the programming operation to the second memory bit cell, the programming voltages applied to the word line, the first control gate, the second control gate, the bit line connected to the source and the bit line connected to the drain are from 1 V to 2 V, from 2 V to 6 V, from 5 V to 11 V, from 0 V to 0.6 V and from 2.5 V to 5.5 V, and preferably 1.5 V, 4 V, 10 V, 0 V and 5 V, respectively.

Furthermore, during a reading operation to the first memory bit cell, reading voltages applied to the word line, the first control gate, the second control gate, the bit line connected to the source and the bit line connected to the drain are from 0.5 V to 5 V, from 0 V to 3 V, from 0 V to 6 V, from 0 V to 0.5 V and from 0.8 V to 3 V, and preferably 2.5 V, 2.5 V, 4 V, 0 V and 2 V, respectively; during the reading operation to the second memory bit cell, the reading voltages applied to the word line, the first control gate, the second control gate, the bit line connected to the source and the bit line connected to the drain are from 0.5 V to 5 V, from 0 V to 6 V, from 0 V to 3 V, from 0.8 V to 3 V and from 0 V to 0.5 V, and preferably 3 V, 3 V, 2.5 V, 2 V and 0.5 V, respectively.

The advantages of the present invention are as follows: a bit line of a memory array is shared by a source and a drain of adjacent transistors, and a part of a word line forms a gate of a memory cell connected to the word line, moreover, the memory array of the present invention uses split-gate memory cells, wherein two memory bit cells of a memory cell share a word line, thereby the read, program and erase of the memory cell can be realized by applying different voltages to the word line, two control gates, and source/drain regions; the word line sharing structure enables a split-gate flash memory to effectively reduce the chip area while maintaining the electrical isolation performance of the chip unchanged and simultaneously avoiding the over-erase problems, and not increasing the complexity of the process.

DETAILED DESCRIPTION OF THE INVENTION

In order to make the purpose, technical solution and advantages of the present invention clearer, the present invention is further detailed in combination with the accompanying drawings.

Figure 1:
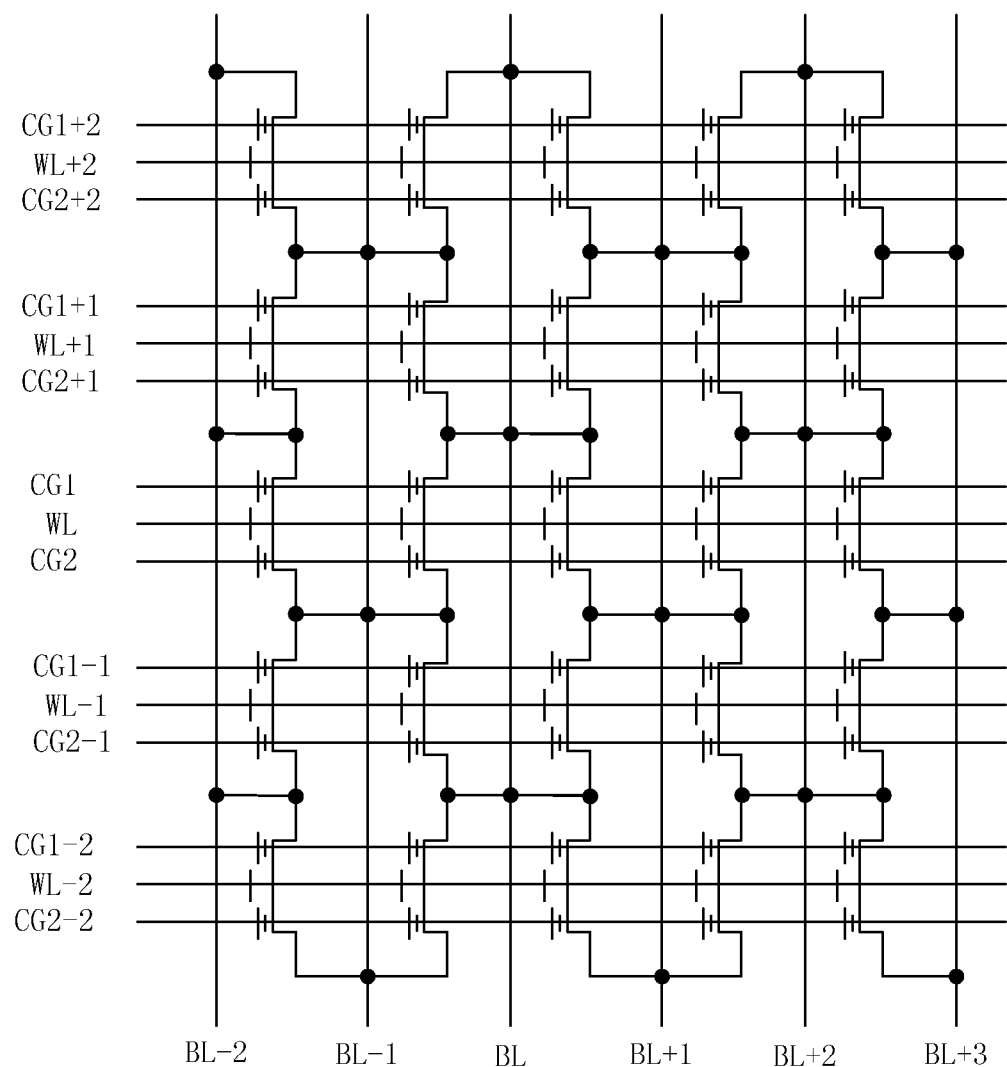
FIG. 1 is a schematic diagram of the memory array according to the present invention.

FIG. 1 is a schematic diagram of the memory array according to the present invention.

As shown in FIG. 1, the memory array according to the present invention comprises:

one or more memory cells;

a plurality of paralleled bit lines BL formed on the semiconductor substrate;

a plurality of word lines WL perpendicular to the bit lines.

wherein, each bit line BL is connected to a source of one memory cell and a drain of another memory cell adjacent to the one memory cell, a part of a word line WL between adjacent bit lines BL is connected to a gate of a memory cell.

Figure 2:
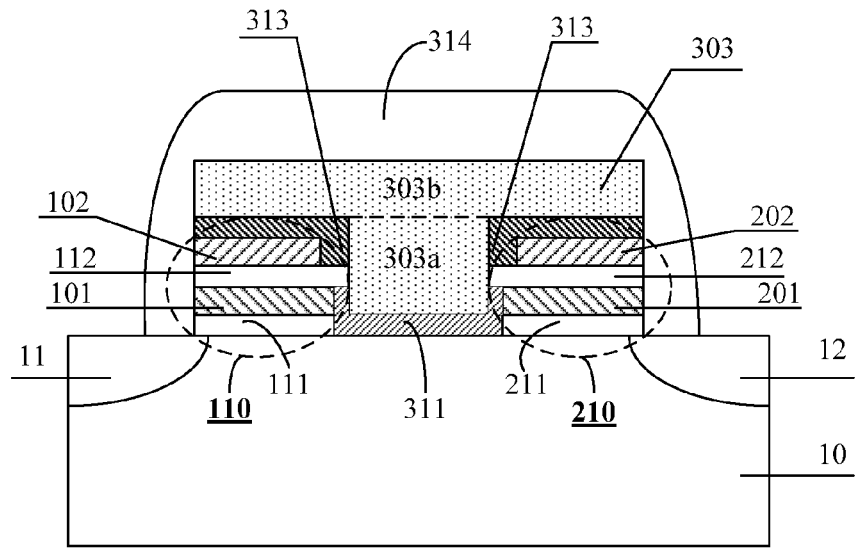
FIG. 2 is a schematic diagram of the semiconductor structure of memory cells in a memory array according to the present invention.

FIG. 2 is a schematic diagram of the semiconductor structure of memory cells in a memory array according to the present invention.

As shown in FIG. 2, in a memory array according to the present invention, a memory cell 100 is a split-gate memory cell, comprising:

a semiconductor substrate 10;

a first active region 11 and a second active region 12 arranged in the semiconductor substrate 10 and spaced apart from each other, in the present embodiment, the first active region 11 is a source doping region S and the second active region 12 is a drain doping region D, the first and second active regions 11 and 12 are respectively picked up by adjacent bit lines of the memory array to connect with external electrodes;

a first memory bit cell 110 formed between a word line 303 and the first active region 11 (i.e. the source doping region S), comprising a first floating gate 101 and a first control gate 102, the first control gate 102 being spaced from and arranged above the first floating gate 101, the first floating gate 101 being connected to an external electrode by a first control line CG1 of the memory array;

a second memory bit cell 210 formed between the word line 303 and the second active region 12 (i.e. the drain doping region D), comprising a second floating gate 201 and a second control gate 202, the second control gate 202 being spaced from and arranged above the second floating gate 201, the second floating gate 201 being connected to an external electrode by a second control line CG2 of the memory array.

In the present embodiment, the word line 303 is isolated from the first/second floating gate 101/102 of the memory cell 100 and the semiconductor substrate 10 by a tunneling oxide layer 311.

In the present embodiment, the first floating gate 101 of the memory cell 100 is isolate from the semiconductor substrate 10 by a gate oxide layer 111 with a thickness from 60 Å to 150 Å; the first floating gate 101 is isolated from the first control gate 102 by an interlayer dielectric film 112, the interlayer dielectric film 112 is an insulating dielectric film with a thickness from 60 Å to 350 Å formed by one of silicon oxide, silicon nitride, silicon oxynitride, carbon-containing silicon oxide or any combination structure thereof.

In the present embodiment, the second floating gate 201 of the memory cell 100 is isolated from the semiconductor substrate 10 by a gate oxide layer 211 with a thickness from 60 Å to 150 Å; the second floating gate 201 is isolated from the second control gate 202 by an interlayer dielectric film 212, the interlayer dielectric film 212 is an insulating dielectric film with a thickness from 60 Å to 350 Å formed by one of silicon oxide, silicon nitride, silicon oxynitride, carbon-containing silicon oxide or any combination structure thereof.

The first control line CG1 and the second control line CG2 are arranged in a same dielectric layer with the word line WL; the control lines CG1 and CG2 are arranged on both sides of the word line WL and being parallel to the word line.

In the present embodiment, the word line 303 of the memory cell 100 comprises a first part 303a and a second part 303b, wherein the first part 303a is arranged between the first memory bit cell 110 and the second memory bit cell 120 and forms the gate of the memory cell 100; the second part 303b is above the first part 303a and extends in both sides, to cover the entire first memory bit cell 110 and the entire second memory bit cell 210.

In the present embodiment, the tunneling oxide layer 311 formed between the word line 303 and the semiconductor substrate 10 as well as between the word line 303 and the first/second floating gate 101/201 is a silicon oxide layer or a silicon nitride layer, or a combination structure thereof and has a thickness from 80 Å to 200 Å. The word line 303 is isolated from the first/second control gates 102/202 by interlayer dielectric films 313, the interlayer dielectric films 313 are insulating dielectric films formed by one of silicon dioxide, silicon nitride, silicon oxynitride, carbon-containing silicon oxide or any combination structure thereof, wherein the thickness of the interlayer dielectric films 313 is from 100 Å to 500 Å and should be larger than that of the tunneling oxide layer 311.

In the present embodiment, both the first floating gate 101 and the second floating gate 201 of the memory cell 100 are polysilicon floating gates or silicon nitride floating gates or nano-crystal materials having electrical conductivity; both the first control gate 102 and the second control gate 202 are polysilicon control gates or metal control gates; the word line 303 is a polysilicon selection gate or a metal selection gate; an insulating dielectric film 314 formed by one of silicon dioxide, silicon nitride, silicon oxynitride, carbon-containing silicon oxide or any combination thereof is deposited on the surfaces and side faces of the first memory bit cell 110, the second memory bit cell 210, and the word line 303 to isolate them from the metal layer (not shown) connecting to the source/drain electrode; when the memory cell 100 is in operation, the first/second memory bit cell 110/210 erases electric charges by applying a high voltage to the word line 303 while the programming operation is performed in a way of hot electron injection.

As an alternative embodiment, the word line WL, the first control line CG1, and the second control line CG2 of a memory array are all arranged below the bit lines BL.

As another alternative embodiment, the word line WL, the first control line CG1, and the second control line CG2 of a memory array are all arranged above the bit lines BL.

As a preferred embodiment, in a memory array, both the first floating gate 101 and the second floating gate 201 of the memory cell 100 are polysilicon floating gates; both the first control gate 102 and the second control gate 202 are polysilicon control gates; the word line 303 is a polysilicon selection gate; the tunneling oxide layer 311 formed between the word line 303 and the semiconductor substrate 10 as well as between the word line 303 and the first/second floating gate 101/201 is a silicon oxide layer and has a thickness of 100 Å; the gate oxide layer 111/211 formed between the first/second floating gate 101/201 and the semiconductor substrate 10 has a thickness of 80 Å; the interlayer dielectric film 112/212 between the first/second floating gate 101/201 and the first/second control gate 102/202 is formed by silicon nitride and has a thickness of 120 Å; the interlayer dielectric film 313 between the word line 303 and the first/second control gate 102/202 is formed by silicon nitride and has a thickness of 200 Å; meanwhile, the first/second memory bit cell 110/120 uses the method of poly to poly erase to reduce the erasing voltage.

As an alternative embodiment, in a memory array, both the first floating gate 101 and the second floating gate 201 of the memory cell 100 are silicon nitride floating gates; both the first control gate 102 and the second control gate 202 are polysilicon control gates; the word line 303 is a polysilicon selection gate; the tunneling oxide layer 311 between the word line 303 and the semiconductor substrate 10 as well as between the word line 303 and the first/second floating gate 101/201 is formed by a stacked structure of silicon dioxide layer and silicon nitride layer and has a thickness of 120 Å; the gate oxide layer 111/211 formed between the first/second floating gate 101/201 and the semiconductor substrate 10 has a thickness of 90 Å; the interlayer dielectric film 112/212 between the first/second floating gate 101/201 and the first/second control gate 102/202 is formed by silicon dioxide and has a thickness of 180 Å; the interlayer dielectric film 313 between the word line 303 and the first/second control gate 102/202 is also formed by silicon dioxide and has a thickness of 300 Å.

As another alternative embodiment, in a memory array, both the first floating gate 101 and the second floating gate 201 of the memory cell 100 are nano-crystal floating gates; both the first control gate 102 and the second control gate 202 are polysilicon control gates; the word line 303 is a metal selection gate; the tunneling oxide layer 311 between the word line 303 and the semiconductor substrate 10 as well as between the word line 303 and the first/second floating gate 101/201 is formed by a silicon oxide layer and has a thickness of 150 Å; the gate oxide layer 111/211 formed between the first/second floating gate 101/201 and the semiconductor substrate 10 has a thickness of 130 Å; the interlayer dielectric film 112/212 between the first/second floating gate 101/201 and the first/second control gate 102/202 is formed by a silicon oxynitride layer and has a thickness of 200 Å; the interlayer dielectric film 313 between the word line 303 and the first/second control gate 102/202 is also formed by a silicon oxynitride layer and has a thickness of 350 Å.

As yet another alternative embodiment, in a memory array, both the first floating gate 101 and the second floating gate 201 of the memory cell 100 are silicon nitride floating gates; both the first control gate 102 and the second control gate 202 are metal control gates; the word line 303 is a metal selection gate; the tunneling oxide layer 311 between the word line 303 and the semiconductor substrate 10 as well as between the word line 303 and the first/second floating gate 101/201 is formed by a stacked structure of silicon dioxide layer and silicon nitride layer and has a thickness of 200 Å; the gate oxide layer 111/211 formed between the first/second floating gate 101/201 and the semiconductor substrate 10 has a thickness of 150 Å; the interlayer dielectric film 112/212 between the first/second floating gate 101/201 and the first/second control gate 102/202 is formed by a stacked structure of silicon dioxide layer, silicon nitride layer, and silicon oxynitride layer and has a thickness of 200 Å; the interlayer dielectric film 313 between the word line 303 and the first/second control gate 102/202 is also formed by a stacked structure of silicon dioxide layer, silicon nitride layer, and silicon oxynitride layer and has a thickness of 400 Å.

Figure 3:
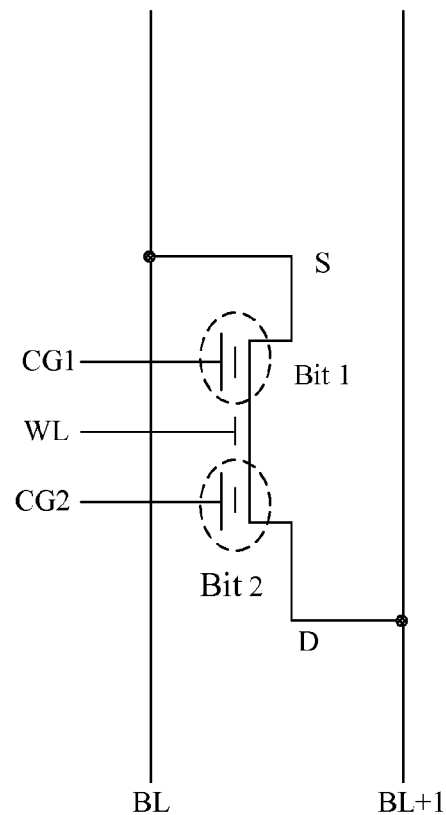
FIG. 3 is a specific schematic diagram showing the connections of a memory cell in a memory array according to the present invention.

FIG. 3 is a specific schematic diagram showing the connections of a memory cell in a memory array according to the present invention.

As shown in FIG. 3, a memory cell comprises a first memory bit cell Bit1 having a first control gate CG1 and a second memory bit cell Bit2 having a second control gate CG2; a gate G of the memory cell is connected to the word line WL, while a source S and a drain D of the memory cell are respectively connected to the bit lines BL and BL+1.

As shown in FIG. 3, the first memory bit cell Bit1 and the second memory bit cell Bit2 of the memory cell share a word line WL; operating voltages are applied to the word line WL, the first control gate CG1, the second control gate CG2, the bit line BL connected to the source S and the bit line BL+1 connected to the drain D to read, program and erase the memory bit cells.

In the present embodiment, both the first memory bit cell Bit1 and the second memory bit cell Bit2 erase electric charges by applying a high voltage to the word line WL, wherein the high voltage applied to the word line WL is from 9 V to 12 V, as a preferred embodiment, the high voltage is 11 V. Meanwhile, the voltage applied to the bit lines BL and BL+1 of the memory array is 0 V.

As an alternative embodiment, both the first memory bit cell Bit1 and the second memory bit cell Bit2 erase electric charges by applying voltages to the word line WL and the control gate CG1/CG2, wherein a high voltage from 5 V to 10 V is applied to the word line WL, a negative voltage from −5 V to −10 V is applied to the control gate CG1/CG2. As a preferred embodiment, during an erasing operation, voltages applied to the word line WL, the first control gate CG1 and the second control gate CG2 are 8V, −7V and −7V respectively, the absolute value of the voltage applied to the word line WL is reduced by applying a negative voltage to the first/second control gate CG1/CG2. Meanwhile, a voltage of 0 V is applied to all the bit lines in the memory array as shown in FIG. 1.

As a preferred embodiment, both the first control gate CG1 and the second control gate CG2 are polysilicon control gates, and the word line WL is a polysilicon selection gate. Meanwhile, the first memory bit cell Bit1 and the second memory bit cell Bit2 use the method of poly to poly erase.

In the present embodiment, a programming operation to both the first memory bit cell Bit1 and the second memory bit cell Bit2 is performed by the method of hot electron injection.

In the present embodiment, during the programming operation to the first memory bit cell Bit1, programming voltages applied to the world line WL, the first control gate CG1, the second control gate CG2, the bit line BL connected to the source S and the bit line BL+1 connected to the drain D are from 1 V to 2 V, from 5 V to 11 V, from 2 V to 6 V, from 2.5 V to 5.5 V and from 0 V to 0.6 V, respectively. In the memory array as shown in FIG. 1, a voltage of about 1.5V to 2.5V is applied to the bit lines BL−1, BL−2, . . . adjacent to the bit line BL connected to the source S and all the bit lines >BL+3; a low voltage from 0.1 V to 0.6 V is applied to the bit lines BL+2 and BL+3 adjacent to the bit line BL+1 connected to the drain D.

As a preferred embodiment, the programming voltages for the programming operation to the first memory bit cell Bit1 are 1.5 V, 10 V, 4 V, 5 V and 0 V, respectively.

As an alternative embodiment, the programming voltages for the programming operation to the first memory bit cell Bit1 are 1.4 V, 8 V, 5 V, 4.5 V and 0.1 V, respectively.

In the present embodiment, during the programming operation to the second memory bit cell Bit2, programming voltages applied to the world line WL, the first control gate CG1, the second control gate CG2, the bit line BL connected to the source S and the bit line BL+1 connected to the drain D are from 1 V to 2 V, from 2 V to 6 V, from 5 V to 11 V, from 0 V to 0.6 V and from 2.5 V to 5.5 V, respectively. Meanwhile, in the memory array as shown in FIG. 1, a low voltage from 0.1 V to 0.6 V is applied to the bit lines BL−1 and BL−2 adjacent to the bit line BL connected to the source S; a voltage of about 1.5V to 2.5V is applied to the bit lines <BL−2 and the bit lines BL+2, BL+3, . . . adjacent to the bit line BL+1 connected to the drain D.

As a preferred embodiment, the programming voltages for programming operation to the second memory bit cell Bit2 are 1.5 V, 4 V, 10 V, 0 V and 5 V, respectively.

As an alternative embodiment, the programming voltages for programming operation to the second memory bit cell Bit2 are 1.4 V, 5 V, 8 V, 0.1 V and 5 V, respectively.

During a reading operation to the first memory bit cell Bit1, reading voltages applied to the world line WL, the first control gate CG1, the second control gate CG2, the bit line BL connected to the source S and the bit line BL+1 connected to the drain D are from 0.5 V to 5 V, from 0 V to 3 V, from 0 V to 6 V, from 0 V to 0.5 V and from 0.8 V to 3 V, respectively. At this time, in the memory array as shown in FIG. 1, voltages of 0 V is only applied to the bit lines BL+2 and BL+3 adjacent to the bit line BL+1 connected to the drain D, and all the other bit lines are floating.

As a preferred embodiment, the reading voltages for reading operation to the first memory bit cell Bit1 are 2 V, 2.5 V, 4 V, 0 V and 2 V, respectively.

As an alternative embodiment, the reading voltages for reading operation to the first memory bit cell Bit1 are 2.5 V, 0 V, 5 V, 0.5 V and 1 V, respectively.

During the reading operation to the second memory bit cell Bit2, reading voltages applied to the world line WL, the first control gate CG1, the second control gate CG2, the bit line BL connected to the source S and the bit line BL+1 connected to the drain D are from 0.5 V to 5 V, from 0 V to 6 V, from 0 V to 3 V, from 0.8 V to 3 V and from 0 V to 0.5 V, respectively. At this time, in the memory array as shown in FIG. 1, a voltage of 0 V is applied to the bit lines BL−1 and BL−2 adjacent to the bit line BL connected to the source S, all the other bit lines are floating.

As a preferred embodiment, the reading voltages for reading operation to the second memory bit cell Bit2 are 3 V, 4 V, 2.5 V, 2 V and 0 V, respectively.

As an alternative embodiment, the reading voltages for reading operation to the second memory bit cell Bit2 are 4 V, 5 V, 0 V, 1 V and 0.5 V, respectively.

In the present embodiment, the bit lines BL of the memory array are shared by the source S and the drain D of adjacent transistors, and a part of a word line WL (303) forms the gate G of the memory cell connected to the word line, moreover, the memory array according to the present embodiment uses split-gate memory cells, wherein two memory bit cells Bit1 and Bit2 of a memory cell share a word line WL, thereby the read and erase of the memory bit cells can be realized by applying different voltages to the word line WL, two control gates CG1 and CG2 as well as the source and drain regions BL and BL+1; the program of the memory bit cells can be realized by hot electron injection. The word line sharing structure enables a split-gate flash memory to effectively reduce the chip area while maintaining the electrical isolation performance of the chip unchanged and simultaneously avoiding the over-erase problems. The memory array adopting the present memory cell structure is much compacter in structure and can increase the density of memory bit cells without increasing the density of the metal lines or increasing the complexity of the process, thus effectively increasing the density of the memory array and reducing the chip area.

Numerous embodiments with great variations can be made without departing from the spirit and scope of the invention. It will be understood that specific embodiments described in the specification shall not be intended to limit the scope of the invention which shall solely be limited by the appended claims.

What is claimed is:

1. A memory array, comprising:
   a plurality of memory cells;
   a plurality of paralleled bit lines formed on a semiconductor substrate, and
   a plurality of word lines perpendicular to the bit lines,
   wherein each bit line is connected to a source and a drain of adjacent memory cells; a part of a word line between adjacent bit lines is connected to a gate of a memory cell; wherein,
   the memory cells are split-gate memory cells, each comprising a first memory bit cell arranged between a word line and a source of the memory cell, and a second memory bit cell arranged between the word line and a drain of the memory cell, the first and the second memory bit cells comprising a first control gate and a second control gate, respectively;
   the memory array further comprises a plurality of first control lines and second control lines connected to the first control gates and the second control gates, respectively, each pair of first control lines and second control lines being arranged on both sides of a word line and being parallel to the word line; and
   wherein the first and second memory bit cells share one word line, the first and second memory bit cells erasing electric charges by applying a high voltage of 9 V to 12 V to the word line or by both applying a high voltage of 5 V to 10 V to the word line and applying a negative voltage of −5 V to −10 V to the first/second control gate.

2. The memory array according to claim 1, wherein a part of a bit line forms the source and the drain of adjacent memory cells connected to the bit line; a part of a word line forms the gate of the memory cell connected to the word line.

3. The memory array according to claim 2, wherein the first memory bit cell further comprises a first floating gate, the first control gate being spaced from and arranged above the first floating gate; the second memory bit cell further comprises a second floating gate, the second control gate being spaced from and arranged above the second floating gate.

4. The memory array according to claim 3, wherein the part of the word line forming the gate of the memory cell is isolated from the semiconductor substrate, the first floating gate and the second floating gate by a tunneling oxide layer; gate oxide layers are formed between the first floating gate and the semiconductor substrate, as well as between the second floating gate and the semiconductor substrate.

5. The memory array according to claim 4, wherein the tunneling oxide layer is a silicon oxide layer or a silicon nitride layer or a combination structure thereof.

6. The memory array according to claim 5, wherein the tunneling oxide layer has a thickness of 80-200 Å.

7. The memory array according to claim 3, wherein interlayer dielectric films are respectively formed between the first floating gate and the first control gate, between the second floating gate and the second control gate, as well as between the word line and the first and second control gates.

8. The memory array according to claim 7, wherein the interlayer dielectric films are insulating dielectric films formed by one of silicon dioxide, silicon nitride, silicon oxynitride, and carbon-containing silicon oxide or any combination structure thereof.

9. The memory array according to claim 3, wherein both the first floating gate and the second floating gate are polysilicon floating gates or silicon nitride floating gates or nanocrystal materials having electrical conductivity; both the first control gate and the second control gate are polysilicon control gates or metal control gates; the word lines are polysilicon selection gates or metal selection gates.

10. The memory array according to claim 3, wherein the word lines and the first and second control lines are all arranged below the bit lines.

11. The memory array according to claim 3, wherein the word lines and the first and second control lines are all arranged above the bit lines.

12. The memory array according to claim 1, wherein both the first and the second control gates of the memory cell are polysilicon control gates; when the word line is a polysilicon selection gate, both the first and second memory bit cells use a poly to poly erase.

13. The memory array according to claim 1, wherein the high voltage applied to the word line is 11 V.

14. The memory array according to claim 1, wherein the high voltage applied to the word line is 8 V, and the negative voltage applied to the first/second control gate is −7 V.

* * * * *